(12) United States Patent
Aoki (10) Patent No.: US 6,806,539 B2
(45) Date of Patent: Oct. 19, 2004

(54) SEMICONDUCTOR DEVICE AND ITS MANUFACTURING METHOD

(75) Inventor: Hitoshi Aoki, Kasaoka (JP)

(73) Assignee: Sharp Kabushiki Kaisha, Osaka (JP)

( * ) Notice: Subject to any disclaimer, the term of this patent is extended or adjusted under 35 U.S.C. 154(b) by 25 days.

(21) Appl. No.: 10/173,764

(22) Filed: Jun. 19, 2002

(65) Prior Publication Data

US 2002/0190323 A1 Dec. 19, 2002

(30) Foreign Application Priority Data

Jun. 19, 2001 (JP) ........................................ 2001-185548

(51) Int. Cl.⁷ .......................................... H01L 31/0392
(52) U.S. Cl. ...................... 257/351; 257/347; 257/369; 257/903
(58) Field of Search ................................ 257/351, 347, 257/369, 903

(56) References Cited

U.S. PATENT DOCUMENTS

| | | | | |
|---|---|---|---|---|
| 4,899,202 A | * | 2/1990 | Blake et al. ................ | 357/23.7 |
| 5,024,965 A | * | 6/1991 | Chang et al. .................. | 437/57 |
| 5,243,213 A | * | 9/1993 | Miyazawa et al. .......... | 257/350 |
| 5,317,181 A | * | 5/1994 | Tyson .......................... | 257/347 |
| 5,359,219 A | * | 10/1994 | Hwang ........................ | 257/351 |
| 5,998,879 A | * | 12/1999 | Iwaki et al. ................. | 257/347 |
| 6,239,649 B1 | * | 5/2001 | Bertin et al. ................. | 327/537 |
| 6,268,630 B1 | * | 7/2001 | Schwank et al. ........... | 257/347 |
| 6,368,903 B1 | * | 4/2002 | Bryant et al. ............... | 438/151 |
| 6,472,712 B1 | * | 10/2002 | Nakura et al. .............. | 257/369 |
| 6,573,549 B1 | * | 6/2003 | Deng et al. ................. | 257/296 |
| 2002/0021145 A1 | * | 2/2002 | Deng .......................... | 326/98 |
| 2002/0105014 A1 | * | 8/2002 | Houston ..................... | 257/200 |
| 2002/0110989 A1 | * | 8/2002 | Yamaguchi et al. ........ | 438/311 |
| 2002/0140030 A1 | * | 10/2002 | Mandelman et al. ....... | 257/347 |

FOREIGN PATENT DOCUMENTS

| | | | |
|---|---|---|---|
| EP | 304 811 | * | 8/1988 |
| JP | 62-109355 | | 5/1987 |
| JP | 7-153854 | | 6/1995 |
| JP | 10-223777 | * | 9/1998 |
| JP | 2000-243973 | * | 9/2000 |
| JP | 2000-332250 | | 11/2000 |
| WO | WO 00/46858 | * | 8/2000 |

* cited by examiner

Primary Examiner—Ahmed N. Sefer
(74) Attorney, Agent, or Firm—Nixon & Vanderhye P.C.

(57) ABSTRACT

A semiconductor device comprising: an SOI substrate having a surface semiconductor layer, a gate electrode formed on the surface semiconductor layer via a gate insulating film, first conductive type source/drain regions formed in the surface semiconductor layer of both sides of the gate electrode, a second conductive type drawing diffusion layer formed in the surface semiconductor layer and contacted with at least one of the first conductive type source/drain regions, and a silicide layer which is formed on the surface semiconductor layer to partially or entirely overlie both said at least one of source/drain regions and the drawing diffusion layer, the silicide layer being grounded.

10 Claims, 7 Drawing Sheets

SEMICONDUCTOR DEVICE AND ITS MANUFACTURING METHOD

CROSS-REFERENCE TO RELATED APPLICATION

This application is related to Japanese application No. 2001-185548 filed on 19 Jun. 2001, whose priority is claimed under 35 USC §119, the disclosure of which is incorporated by reference in its entirety.

BACKGROUND OF THE INVENTION

1. Field of the Invention

The present invention relates to a semiconductor device and its manufacturing method, and more particularly to a semiconductor device formed on an SOI (Silicon On Insulator) substrate and its manufacturing method.

2. Description of the Prior Arts

Figure 1:
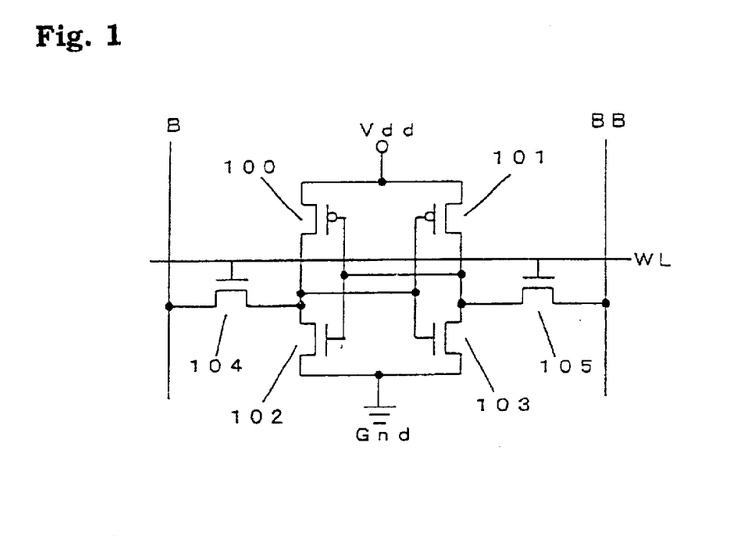
FIG. 1 is a view showing an equivalent circuit of a semiconductor memory device according to the present invention.

A basic CMOS (Complementary Metal Oxide Semiconductor)/SRAM (Static Random Access Memory) cell conventionally used has, as shown in FIG. 1, a flipflop circuit comprising two load PMOS transistors 100, 101 and two driving NMOS transistors 102, 103 as well as two transfer NMOS transistors 104, 105.

Figure 8A:
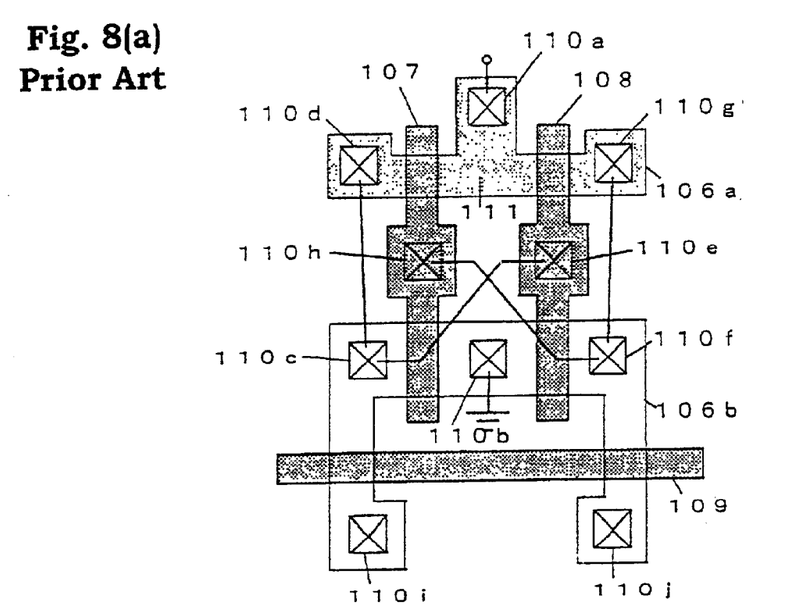
Figure 8B:
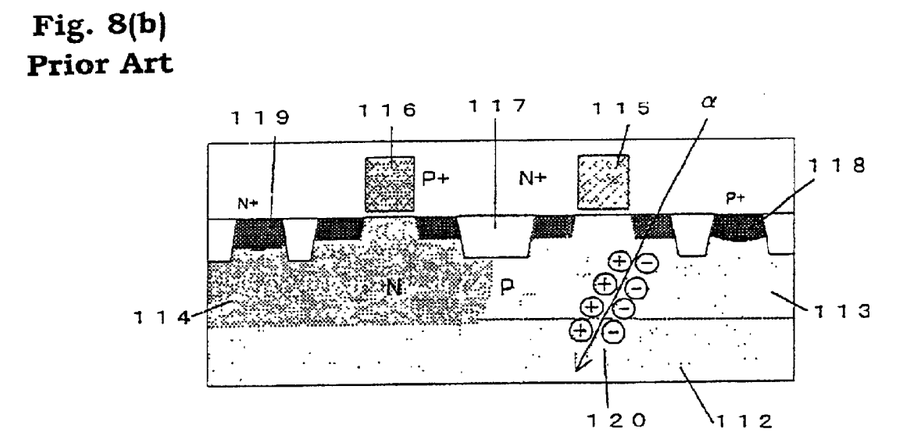

The CMOS/SRAM cell of this type has a structure shown in FIGS. 8(a) and 8(b). Specifically, a p-well region 113 and n-well region 114 are formed in a silicon substrate 112 via a device isolating oxide film 117. An NMOS transistor 115 is formed at an active region in the p-well region 113, while a PMOS transistor 116 is formed at an active region in the n-well region. Provided on each surface of the p-well region 113 and n-well region 114 are $p^+$ diffusion layer 118 and $n^+$ diffusion layer 119, respectively. The p-well region 113 is grounded via the $p^+$ diffusion layer 118, while the n-well region 114 is supplied with Vdd potential via the $n^+$ diffusion layer 119. This brings a pn-junction between the p-well region 113 and the n-well region 114 into a reverse-bias state, thereby realizing a device isolation.

The CMOS/SRAM of this type has a problem of the occurrence of soft error due to alpha-ray. This becomes a subject for realizing a highly reliable device.

Specifically, a LSI chip on which CMOS/SRAM is formed is generally sealed with a resin for use. A neutron produced due to alpha-ray or cosmic rays emitted from an radioactive element included in the resin that is a sealing material is sometimes incident to the LSI chip. As shown in FIG. 8(b), this alpha-ray or neutron causes an electron-hole pair 120 in the silicon substrate 112 by an electrolytic dissociation. These electrons and holes are respectively drawn by a positive potential and negative potential and move in the silicon substrate 112. For example, electrons are drawn to the drain region that is biased to a positive potential in the case of NMOS transistor. When the electrons or holes produced by alpha-ray invade into a data storing node of the SRAM cell, the node potential is inverted thereby causing a malfunction such as data rewriting.

Figure 9:
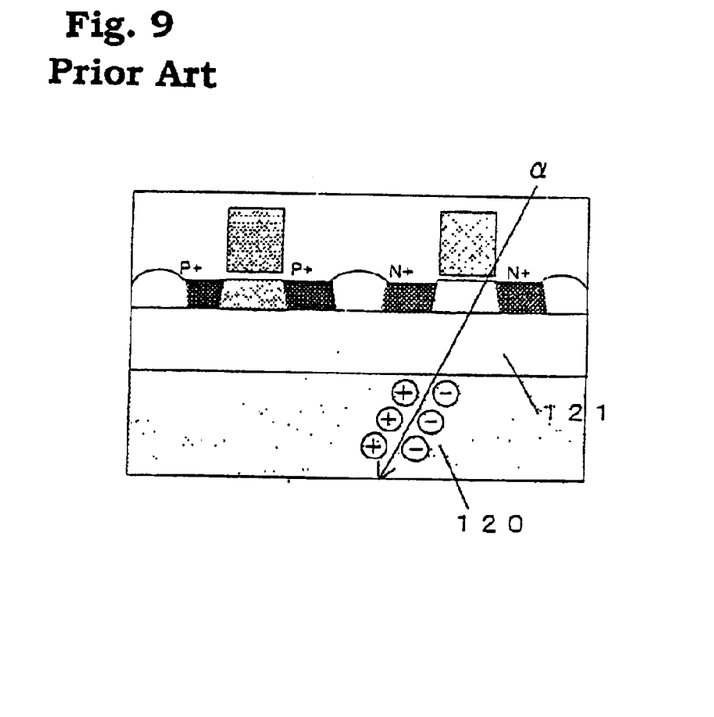
FIG. 9 is a sectional view of a conventional semiconductor memory device formed on an SOI substrate.

An SOI/CMOS technique has been proposed with respect to this. The SOI/CMOS circuit, as shown in FIG. 9, does not require the formation of a well used for isolating the $n^+$ diffusion layer formed $p^+$ diffusion layer although the above-mentioned bulk CMOS/SRAM cell circuit requires the formation of the well. In the SOI/CMOS circuit, a MOS transistor or diffusion layer is formed on a silicon layer above an insulating film 121. Each element is perfectly isolated from the substrate by this insulating film 121. Accordingly, electron-hole pair 120 produced in the bulk substrate due to alpha-ray does not give an influence to each element, whereby data is hardly rewritten.

Japanese Unexamined Patent Application No. HEI7-153854 discloses an SOI/SRAM cell structured such that source/drain regions of a load PMOS transistor and driving NMOS transistor which are adjacent to each other directly forms a PN-junction. This application also discloses that a well isolation or contact (corresponding to 110d, 110g in FIG. 8(a)) is unnecessary because of this PN-junction, resulting in being capable of reducing the cell area.

A transistor fabricated on the SOI substrate is classified into two types in view of its structure, i.e., into a full depletion type and a partial depletion type. Specifically, the maximum value of the width of the depletion layer (maximum depletion layer width) is determined according to an impurity concentration implanted into a silicon layer at a channel region of the SOI. A transistor wherein the maximum depletion layer width is greater than the thickness of the silicon layer at the channel region is called a full depletion type SOI transistor, while a transistor wherein the maximum depletion layer width is smaller than the thickness of the silicon layer at the channel region is called a partial depletion type SOI transistor.

As for the transistor fabricated on the SOI substrate, a parasitic capacitance (junction capacitance) between a drain and a substrate can be reduced. In the case of a full depletion type SOI transistor wherein a thickness of a silicon layer is made thin such as the same as or smaller than approximately 50 nm, in particular, a short channel effect (a reduction in a threshold voltage with the decrease in a gate length and increase in subthreshold coefficient) can be reduced, whereby a substrate floating effect hardly occurs. Therefore, a merit of the full depletion type SOI transistor can be greatly enjoyed by a high-technology device of a micro-structural level wherein a body contact is unnecessary and a layout area can be reduced, compared to a partial depletion type transistor wherein a body contact is generally required.

However, as a memory cell is reduced and voltage is lowered, an electric current which can be supplied to the memory cell is decreased. Therefore, it is difficult to ensure a soft error resistance. Even the SOI structure is insufficient for satisfying a demand for a super highly reliability of a general $\frac{1}{1000}$ level with respect to the incident of low-energy alpha-ray that produces electron-hole pairs at the shallow region of the substrate surface. This fits the full depletion type SOI structure having thinner body region.

The silicon layer of the SOI substrate becomes electrically a floating state in the SOI structure. Therefore, a parasitic bipolar transistor occurs in the MOS transistor fabricated on the silicon layer. For example, an npn-type parasitic bipolar transistor occurs in the NMOS transistor by a p-type channel region and n-type source/drain regions.

Figure 10:
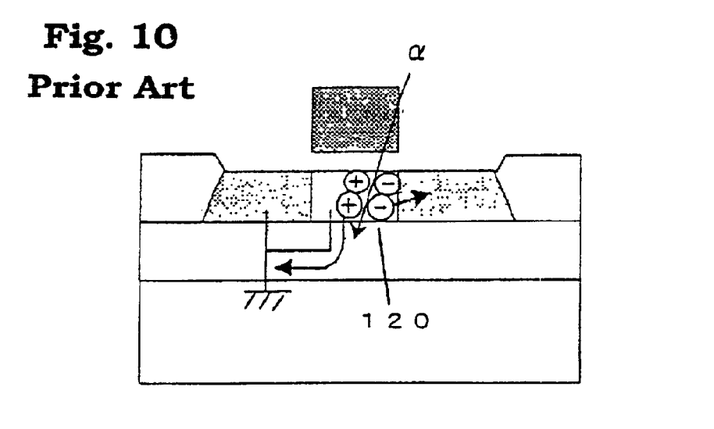
FIG. 10 is a sectional view for explaining a subject of a conventional semiconductor memory device formed on an SOI substrate.

In case where electron-hole pairs 120 are produced at the channel region due to alpha-ray when data is stored, electrons are drawn out into the drain in the npn-type parasitic bipolar transistor as shown in FIG. 10. On the other hand, holes are accumulated on the channel region. This channel region corresponds to a base of the npn-type parasitic bipolar transistor. Accordingly, a potential of the base rises up due to the accumulated holes, thereby operating the npn-type parasitic bipolar transistor. As a result, the NMOS transistor is turned on, whereby the potential of data storing node decreases for reversing the stored data.

SUMMARY OF THE INVENTION

The present invention is accomplished in view of the above circumstances, and aims to provide a semiconductor device provided with a highly reliable CMOS/SRAM cell using an SOI substrate having an excellent soft error resistance, and its manufacturing method.

The present invention provides a semiconductor device comprising:

an SOI substrate having a surface semiconductor layer, a gate electrode formed on the surface semiconductor layer via a gate insulating film, first conductive type source/drain regions formed in the surface semiconductor layer of both sides of the gate electrode, a second conductive type drawing diffusion layer formed in the surface semiconductor layer and contacted with at least one of the first conductive type source/drain regions, and a silicide layer which is formed on the surface semiconductor layer to partially or entirely overlie both said at least one of source/drain regions and the drawing diffusion layer, the silicide layer being grounded.

Further, the present invention provides a semiconductor device comprising:

an SOI substrate having a surface semiconductor layer, a gate electrode formed on the surface semiconductor layer via a gate insulating film, first conductive type source/drain regions formed in the surface semiconductor layer of both sides of the gate electrode, a second conductive type drawing diffusion layer formed in the surface semiconductor layer and contacted with at least one of the first conductive type source/drain regions, and a first conductive type impurity diffusion layer which is formed in the surface semiconductor layer and adjacent to the drawing diffusion layer, the first and conductive type impurity diffusion layer being grounded.

Moreover, the present invention provides a method for manufacturing a semiconductor device having a CMOS transistor on a SOI substrate comprising:

(a) forming a gate electrode on the SOI substrate via a gate insulating film;

(b) forming a resist mask having an opening at a region where a second conductive type drawing diffusion layer is formed and a region where a second conductive type MOS transistor is formed, and ion-implanting a second conductive type impurity by using the mask to form a second conductive type source/drain regions and the second conductive type drawing diffusion layer, and (c) forming a first conductive type source/drain region at the region where the first conductive type MOS transistor is formed, and ion-implanting a first conductive type impurity.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 8 are plan view and sectional view of a conventional semiconductor memory device;

DESCRIPTION OF THE PREFERRED EMBODIMENT

A semiconductor device of the present invention has a gate insulating film and gate electrode formed on an SOI substrate, and first conductive type source/drain regions, and further has a second conductive type drawing diffusion layer.

Examples of the usable SOI substrate include a bond-and-etch-back SOI (BESOI) substrate, SIM (Separation by Implantation of Oxygen) substrate or the like. Such substrate is generally structured by forming an embedded insulating film formed on a support substrate and forming a surface semiconductor layer thereon.

Various substrates can be used for the support substrate such as, for example, a semiconductor substrate using an element of silicon, germanium or the like, a semiconductor substrate using compound of GaAs, InGaAs or the like, among which a single crystalline silicon substrate is preferable. In the case of the semiconductor substrate, the one having relatively low resistance (for example, approximately 200 ohm cm or less, preferably about 100 ohm cm) is preferable.

Examples of the embedded insulating film may include $SiO_2$ film, SiN film or the like, among which $SiO_2$ film is preferable. The thickness of the embedded insulating film can suitably be adjusted considering properties of the semiconductor device to be obtained or value of apply voltage upon using the obtained semiconductor device. For example, it may be approximately 50 to 1000 nm.

The semiconductor layer is a semiconductor thin film functioning as an active layer for forming a transistor. It can be made of a thin film of an element semiconductor such as silicon, germanium or the like, or compound semiconductor such as GaAs, InGaAs or the like. In particular, a silicon thin film is preferable, and this silicon thin film is more preferably a single crystalline silicon. The thickness of the semiconductor layer can suitably be adjusted considering the structure of a semiconductor device to be obtained. For example, it may be approximately 30 to 1000 nm. The semiconductor layer having a thickness of about 30 to 100 nm may be preferable for obtaining a full depletion type semiconductor device.

The gate insulating film and gate electrode are not specifically limited if they are formed by the same material and same method as the semiconductor device such as MOS transistor or the like.

The first conductive type source/drain regions are not specifically limited in its size, impurity concentration and junction depth if they are formed by the same manner as source/drain regions formed as a semiconductor device such as a general MOS transistor. For example, the regions having the junction depth same as that of the surface semiconductor device may be preferable. The impurity concentration may be suitably about $1\times10^{21}$ cm$^{-3}$. It is to be noted that the first conductive type means either one of N-type or P-type. Examples of N-type include boron or $BF_2$, while examples of P-type include arsenic or phosphorus. The source/drain regions may be LDD structure or DDD structure.

The second conductive type drawing diffusion layer is formed in contact with at least one of the first conductive type source/drain regions in the semiconductor device of the present invention. The drawing diffusion layer means a diffusion layer in order to draw out holes or electrons, preferably holes at the active region (channel region). The second conductive type means P-type when the source/drain regions are N-type, while N-type when the source/drain regions are P-type. A preferable structure is that the source/drain regions are N-type and drawing diffusion layer is P-type for drawing out and eliminating holes whose accumulation becomes a problem at a channel region. Although the size of the drawing diffusion layer is not specifically limited, the drawing diffusion layer is required to have a size sufficient to draw out holes produced in the channel region. The position where the drawing diffusion layer is formed is not specifically limited. The formation of the drawing diffusion layer at the region formed as a conventional device isolation region does not entail the increase in a cell area.

The drawing diffusion layer may be formed as one region so as to be in contact with one of the source/drain regions, two regions so as to be in contact with both of the source/drain regions, respectively, or two or more drawing diffusion layers may be formed so as to be in contact with two sides of one of the source/drain regions.

The impurity concentration of the drawing diffusion layer is not specifically limited. It may be approximately same as that in the source/drain regions.

The second conductive type drawing diffusion layer may be partially or entirely coated with a silicide layer. The silicide layer may also partially or entirely coat over the first conductive type source/drain region. In other words, the silicide layer may coat at least a portion of the drawing diffusion layer, more preferably, it coats all over the drawing diffusion layer. Further, the silicide layer may be formed on the entire or the partial region of the source/drain region and/or on the gate electrode. Examples of the silicide layer include $TiSi_2$, $CoSi_2$, $WSi_2$, $PtSi$, $MoSi_2$, $Pd_2Si$, $TaSi_2$, or the like. Although the thickness of the silicide layer is not specifically limited, it is, for example, approximately 5 to 100 nm.

When the silicide layer is formed, ground potential, power potential or optional potential is preferably given to the silicide layer. A method for affording ground potential to the silicide layer include forming a wiring connected to the silicide layer with a conductive film that is well-known in this technical field. By this, holes or electrons (preferably holes) accumulated in the channel region of the semiconductor device are drawn out and eliminated through the silicide layer on the drawing diffusion layer.

The second conductive type drawing diffusion layer may be adjacent to a first conductive type impurity diffusion layer that is different from the above-mentioned first conductive type source/drain regions. The first conductive type impurity diffusion layer may be a region formed only for this purpose on the position adjacent to the second conductive type drawing diffusion layer. The impurity concentration of the first conductive type in this case is suitably about $1\times10^{21}$ cm$^{-3}$. Further, it may be the one utilizing a first type impurity diffusion layer composing another semiconductor device (or element). For example, it may be the one formed as source/drain regions of a semiconductor device (or element) different from the above-mentioned first conductive type source/drain regions. Specifically, the second conductive type drawing diffusion layer may be formed so as to be in contact with one of the source/drain regions of each semiconductor device (or element) between two semiconductor devices (or elements). Moreover, the second conductive type drawing diffusion layer may be adjacent to another two or more first conductive type impurity diffusion layers. Specifically, a plurality of semiconductor devices (or elements) are radially formed with the second conductive type drawing diffusion layer as a center such that one of the source/drain regions of each semiconductor device (or element) comes in contact with the second conductive type drawing diffusion layer (for example, referring to FIG. 7). In this case, ground potential or optional potential is preferably given to the first conductive type impurity diffusion layer, more preferably ground potential is given thereto. Examples of a method for giving ground potential include forming a wiring connected to the first conductive type impurity diffusion layer. By this, holes or electrons (preferably holes) accumulated in the channel region of the semiconductor device are drawn out and eliminated from the drawing diffusion layer through the first conductive type impurity diffusion layer.

When the second conductive type drawing diffusion layer is connected to the first conductive type impurity diffusion layer, the silicide layer may not be formed on these regions. However, the silicide layer is preferably formed to partially or entirely overlie both said at least one of the first conductive type source/drain regions and the second conductive type drawing diffusion layer as described above. Further the silicide layer may extend onto the first conductivity impurity diffusion layer.

The semiconductor device of the present invention can be used for any transistor if it includes NMOS or PMOS transistor in particular. Further, it can be applied for DRAM, SRAM, non-volatile RAM, content addressable memory (CAM), logic circuit, EPROM, EEFROM, flipflop circuit, shift resister or various logic circuits used in this technical field.

The semiconductor device of the present invention can easily be fabricated, in the case of singly forming PMOS or NMOS, by ion-implanting a second conductive type impurity with the use of a mask having an opening only toward the region where the second conductive type drawing diffusion layer is formed at the position adjacent to the source/drain region before or after the ion implantation for forming the first conductive type source/drain regions.

In the case of forming CMOS on the same SIO substrate, a gate electrode is firstly formed via a gate insulating film with a method well-known in this technical field at a process (a).

Subsequently, a resist mask is formed at a process (b) having an opening toward the region where the second conductive type drawing diffusion layer is formed and the region where the second conductive type MOS transistor is formed. The second conductive type impurity is ion-implanted by using the mask to form the second conductive type source/drain regions and second conductive type drawing diffusion layer at the region where the second conductive type MOS transistor is formed. Specifically, the ion implantation performed for forming the source/drain regions of the second conductive type MOS transistor can be utilized for the formation of the second conductive type drawing diffusion layer without forming an additional mask. Accordingly, a further process for forming the second conductive type drawing diffusion layer is not required.

Then, the first conductive type impurity is ion-implanted at the region where the first conductive type MOS transistor is formed for forming the first conductive type source/drain regions at a process (c). The first conductive type source/drain regions can be formed by a known method. For example, a mask covering the region where the second conductive type MOS transistor is formed and the region where the second conductive type drawing diffusion layer is formed is fabricated. The first conductive type source/drain regions can be formed by ion-implanting the first conductive type impurity with the use of the mask. This process (c) may be performed before the process (b).

The silicide layer is preferably formed all over the first conductive type source/drain region and the second conductive drawing diffusion layer after these processes. The silicide layer can be formed by the following steps. At first, a metal film such as Ti, Co, W, Pt, Mo, Pd, Ta or the like is formed with a sputtering method, vacuum deposition method, EB method or the like in a thickness of about 5 to 100 nm. The resultant is subject to heat treatment within a temperature of about 300 to 1000° C. with a lamp anneal, furnace anneal, RTA or the like. Thereafter, the unreacted metal film is removed by a wet etching that uses acid or alkali solution as an etchant, thereby forming the silicide layer.

The first conductive type impurity diffusion layer adjacent to the second conductive type drawing diffusion layer can be formed simultaneous with the above-mentioned ion implantation by, for example, using a mask having an opening toward the first conductive type impurity diffusion layer at the process (c).

In the present invention, an interlayer insulating film, contact hole, wiring layer or protecting layer that is formed in an ordinary semiconductor process may be formed after the aforesaid processes, and further, processes of ion implantation, formation of the side wall spacer or heat treatment may be additionally performed.

An embodiment of the semiconductor device and its manufacturing method of the present invention will be explained hereinbelow with reference to drawings.

A CMOS/SRAM cell that is a semiconductor device of the present invention has, as shown in FIG. 1, a flipflop circuit comprising two load PMOS transistors 100, 101 and two driving NMOS transistors 102, 103 as well as two transfer NMOS transistors 104, 105.

Specifically, each source terminal of two load PMOS transistors 100, 101 is connected to a power source line (Vdd). Each drain terminal thereof is connected to each drain terminal of the driving NMOS transistors 102, 103, while each gate terminal is connected to each gate terminal of the driving NMOS transistors 102, 103. The source terminals of two driving NMOS transistors 102, 103 are connected to ground (Gnd) lines respectively. In this way, two PMOS transistors 100, 102 and two driving NMOS transistors 102, 103 compose two sets of CMOS inverters. These two sets of CMOS inverters are connected to each other such that the input terminal of one of the CMOS inverters is connected to the output terminal of the other, resulting in composing a so-called flipflop circuit.

One of the source/drain terminals of each of two transfer NMOS transistors 104, 105 is connected respectively to the output terminals of two sets of CMOS inverters, while the other source/drain terminal of each of two transfer NMOS transistors 104,105 is connected respectively to two bit lines B and BB. Each gate terminal of two transfer NMOS transistors 104, 105 is connected respectively to a word line WL. It is to be noted that a signal reverse to the signal inputted to the bit line B is inputted to the bit line BB.

When the potential of the word line WL, is "high", two transfer NMOS transistors 104, 105 are turned on in the CMOS/SRAM cell having the aforementioned structure. Therefore, data is written to the flipflop circuit or read out from the flipflop circuit by a complementary signal transmitted through the bit line B or BB. On the other hand, when the potential of the word line WL is "low", two transfer NMOS transistors 104, 105 are turned off, whereby data written in the flipflop circuit immediately before this state is maintained.

Embodiment 1

Figure 2:
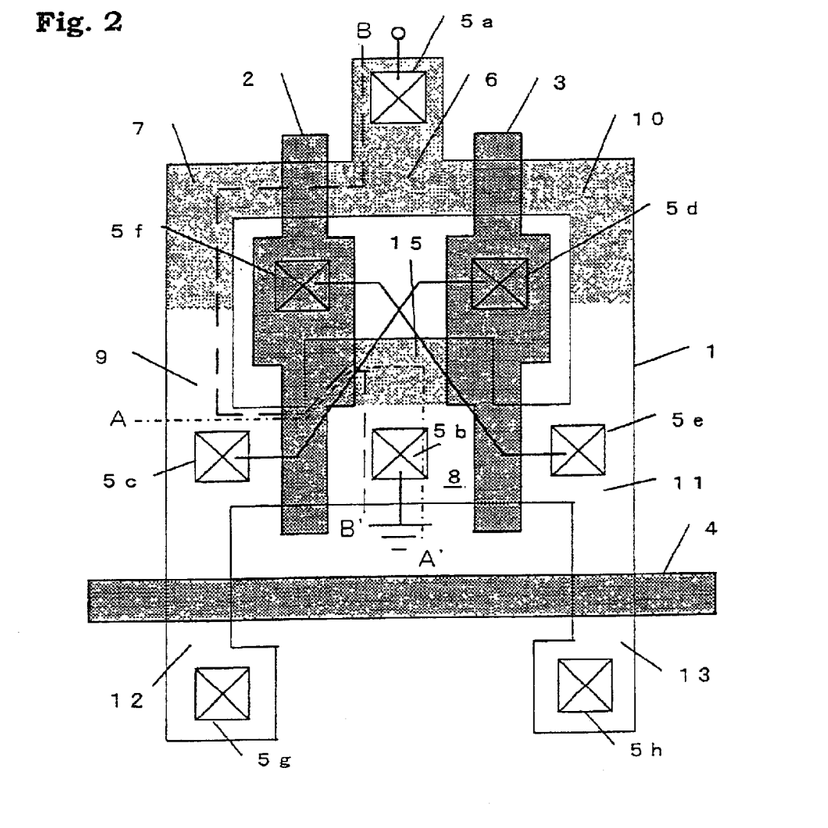
FIG. 2 is a schematic plan view showing an essential section of an embodiment of a semiconductor memory device according to the present invention.

The CMOS/SRAM in this embodiment has, as shown in FIG. 2, gate electrodes 2, 3 and 4 on an active region of an SOI substrate. Contact holes 5a to 5f are formed on the active region. Contact holes 5g and 5h are formed on the gate electrodes 2 and 3. The wiring layout above the gate electrodes 2, 3 and 4 is omitted from FIG. 2. It is to be noted that the active region means a region where a source and a drain as well as a channel region of MOS transistor are formed.

The gate electrode 2 as well as $p^+$ diffusion layers 6 and 7 that are source and drain compose the PMOS transistor 100, while the gate electrode 2 as well as $n^+$ diffusion layers 8 and 9 that are source and drain compose the NMOS transistor 102. The gate electrode 3 as well as $p^+$ diffusion layers 6 and 10 that are source and drain compose the PMOS transistor 101, while the gate electrode 3 as well as $n^+$ diffusion layers 8 and 11 that are source and drain compose the NMOS transistor 103. Further, the gate electrode 4 as well as $n^+$ diffusion layers 9 and 12 that are source and drain compose the NMOS transistor 104, while the gate electrode 4 as well as $n^+$ diffusion layers 11 and 13 that are source and drain compose the NMOS transistor 105. The NMOS transistors 104 and 105 are used without specifying respective source and drain.

The contact hole 5a is connected to the power source line (Vdd) via a metal wiring (not shown), while the contact hole 5b is connected to the ground line (Gnd) via a metal wiring (not shown). Specifically, the $p^+$ diffusion layer 6 is connected to the power source line so that Vdd potential is given thereto, while the $n^+$ diffusion layer 8 is connected to the ground line so that Gnd potential is given thereto.

The $p^+$ diffusion layer 7 and $n^+$ diffusion layer 9 are arranged to be adjacent to each other for composing a single diffusion layer. This diffusion layer is connected to the gate electrode 3 via metal wirings (not shown) connected to the contact holes 5c and 5d. The $p^+$ diffusion layer 10 and $n^+$ diffusion layer 11 are arranged to be adjacent to each other for composing a single diffusion layer. This diffusion layer is connected to the gate electrode 2 via metal wirings (not shown) connected to the contact holes 5e and 5f.

Further, the contact holes 5g and 5h are connected to the bit lines B and BB respectively via metal wirings (not shown). The gate electrode 4 composes the word line WL.

Figure 3:
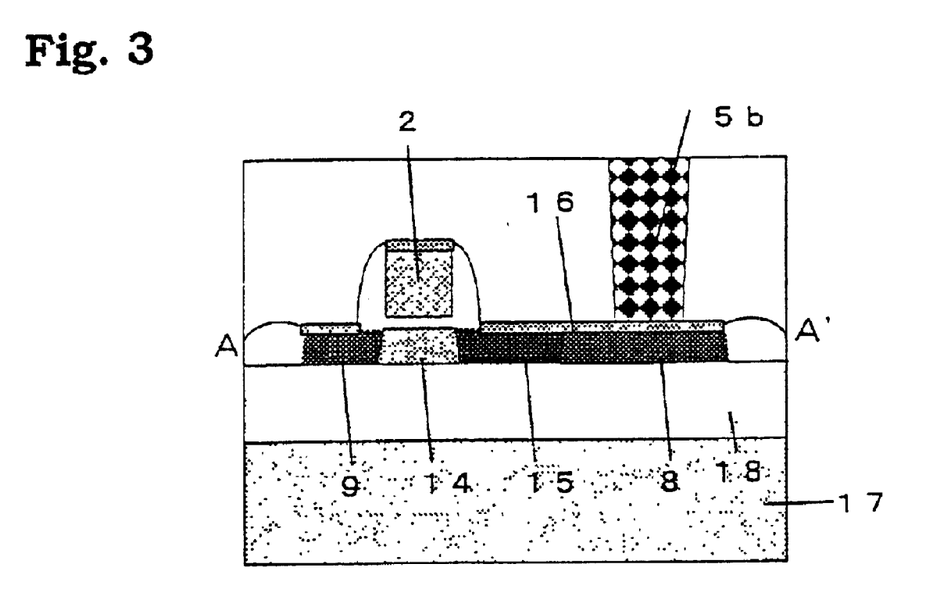
FIG. 3 is a sectional view taken along A–A' line in FIG. 2.

The SOI/CMOS is, as shown in FIG. 3, formed on the SOI substrate having an embedded oxide film 18 and surface silicon layer laminated in this order on a p-type silicon substrate 17. Each of the MOS transistors is electrically isolated from the substrate 17 by the embedded oxide film 18. The $p^+$ diffusion layer 7 of the PMOS transistor and the $n^+$ diffusion layer 9 of the NMOS transistor come in direct contact with each other, whereby a well for electrically isolating MOS transistors each being different type is unnecessary.

The drawing $p^+$ diffusion layer 15 from the p-type body region 14 of the driving NMOS transistor is formed so as to be adjacent to the $n^+$ diffusion layer 8 that is a source. A salicide layer 16 for decreasing resistance covers all over the $n^+$ diffusion layer 9 and the gate electrode 2 as well as all over from the drawing $p^+$ diffusion layer 15 from the $n^+$ diffusion layer 8. The drawing $p^+$ diffusion layer 15 and $n^+$ diffusion layer 8 are electrically and directly connected to each other. Therefore, holes generated in the body due to alpha-ray are assuredly drawn out.

The drawing $p^+$ diffusion layer 15 is arranged at a space region between the gate electrodes 2 and 3. This means that the drawing $p^+$ diffusion layer can be added without increasing the cell area, whereby SRAM chip size is not required to be enlarged. Further, the drawing $p^+$ diffusion layer 15 can be formed simultaneous with the formation of the $p^+$ diffusion layers 6, 7 and 10 for the source and drain of the PMOS transistor, thereby being capable of obtaining a highly reliable SRAM cell with low cost without increasing a process.

This CMOS/SRAM can reduce the soft error ratio of a device to approximately 0.8 FIT (failure in time), compared to 30 FIT in a conventional SOI/SRAM cell.

This CMOS/SRAM can be fabricated in the following manner.

Firstly, the embedded insulating film 18 and the surface silicon layer are formed on the silicon substrate 17, whereupon the device isolation region is formed with LOCOS oxidation. The surface silicon layer is made to have a thickness for realizing a full depletion, for example, approximately 50 nm. Thereafter, a channel implantation is performed of the NMOS and PMOS transistors by a known method for forming the gate electrode 2 via the gate insulating film. After the implantation process for forming the LDD region, a side wall spacer is formed at the side wall of the gate electrode 2.

Figure 4A:
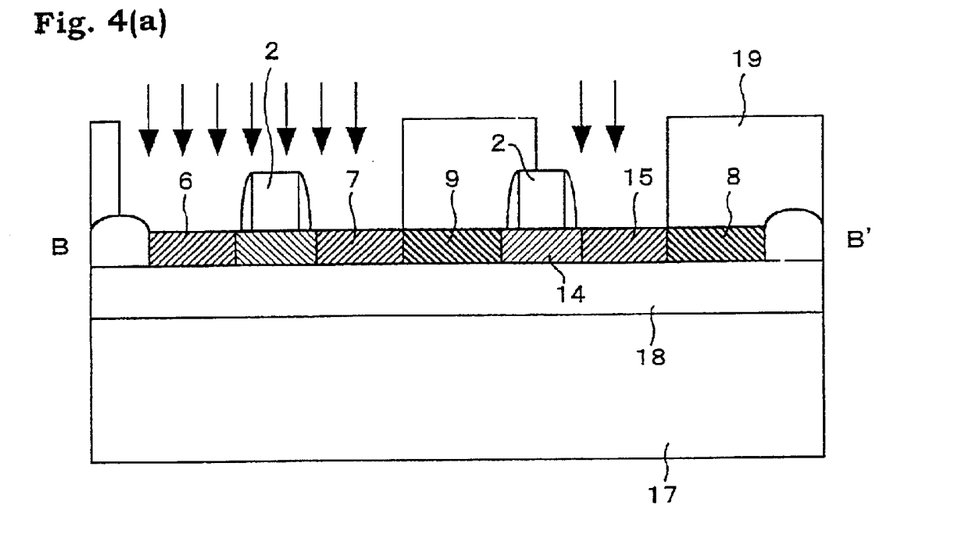
FIG. 4 is a schematic sectional view of an essential section for explaining a method for manufacturing a semiconductor memory device.

Subsequently, a resist pattern (not shown) covering the PMOS transistor region is formed. An n-type impurity is ion-implanted with this resist pattern as a mask. Thereafter, a resist pattern 19 is formed as shown in FIG. 4(a) that has an opening toward the region where the drawing $p^+$ diffusion layer 15 is formed and the PMOS transistor region and covers the NMOS transistor region. A p-type impurity, for example, $BF_2+$ is ion-implanted with a dose of 3 to $5 \times 10$ $cm^{-2}$ at 30 keV with this resist pattern 19 as a mask.

Figure 4B:
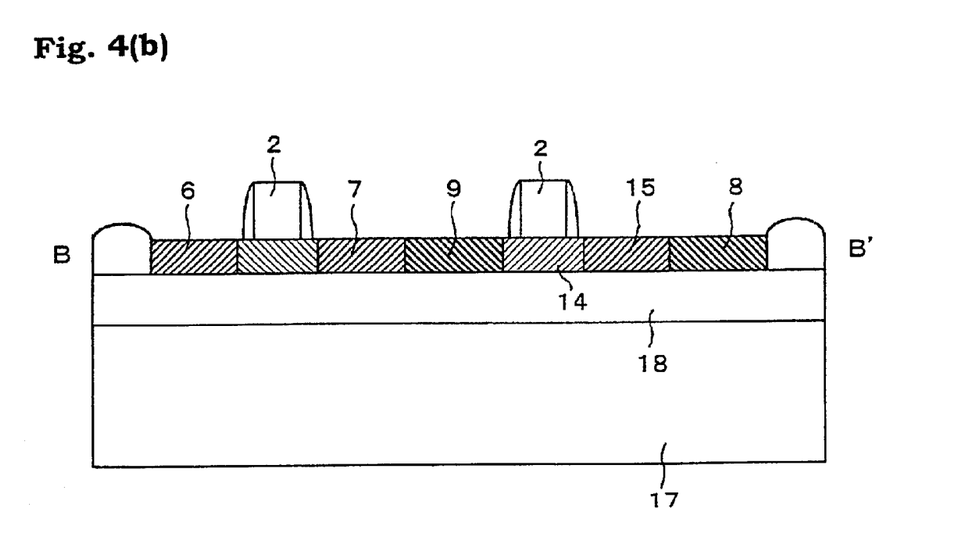

Then, execution of the activation anneal forms the $p^+$ diffusion layers 6 and 7, $n^+$ diffusion layers 8 and 9 and the drawing $p^+$ diffusion layer 15 as shown in FIG. 4(b).

Thereafter, the salicide layer 16 is formed on the gate electrode 2, $p^+$ diffusion layers 6 and 7, $n^+$ diffusion layers 8 and 9 and the drawing $p^+$ diffusion layer 15 with a known method. Then, the interlayer dielectric, contact holes, wiring layer, protecting layer or the like are successively formed to complete the former process.

This method for manufacturing the semiconductor memory device can form the drawing $p^+$ diffusion layer 15 without adding a special process.

Embodiment 2

Figure 5:
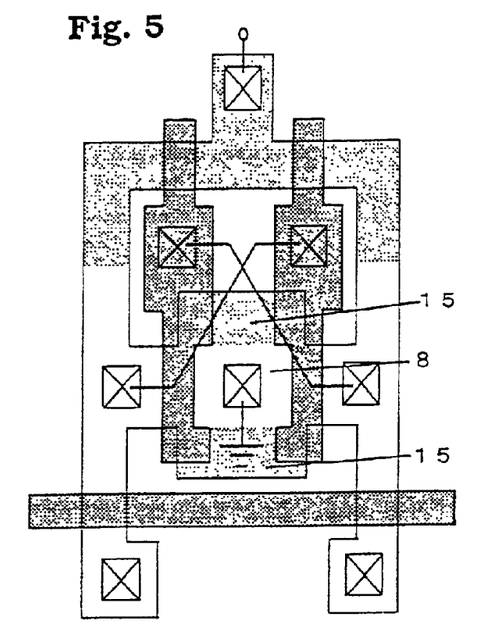
FIG. 5 is a schematic plan view showing an essential section of another embodiment of a semiconductor memory device according to the present invention.

The CMOS/SRAM cell in this embodiment is fabricated such that the $p^+$ diffusion layers 15 in the body region of the driving NMOS transistors are formed at both sides adjacent to the driving NMOS transistors as shown in FIG. 5.

This structure can double the hole-drawing efficiency, thereby being capable of obtaining a SRAM cell having higher soft error resistance.

Embodiment 3

Figure 6:
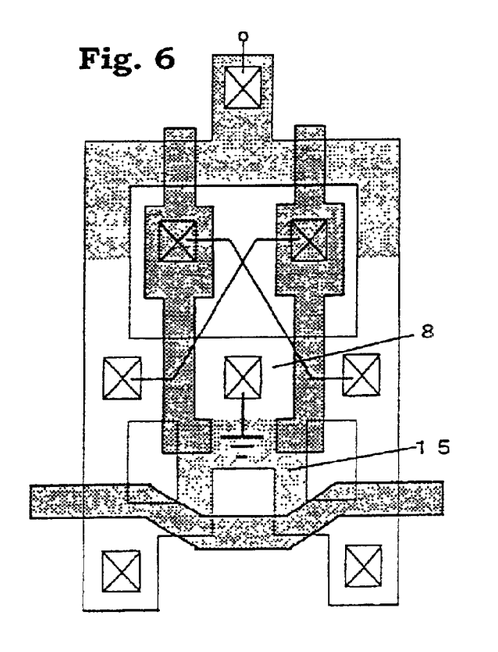
FIG. 6 is a schematic plan view showing an essential section of still another embodiment of a semiconductor memory device according to the present invention.

The CMOS/SRAM cell in this embodiment is fabricated such that the drawing $p^+$ diffusion layer 15 is connected not only to the body region of the driving NMOS transistors but also to the body region of the transfer NMOS transistors as shown in FIG. 6. Specifically, the transfer NMOS transistors are bidirectionally used and the source/drains are not fixed. Therefore, the drawing $p^+$ diffusion layer 15 in the body region of the transfer NMOS transistors is not connected to either of source/drain region but directly connected to the $n^+$ diffusion layer 8 connecting to the Gnd terminal.

This structure prevents the malfunction of the driving NMOS transistors, and also prevents the malfunction of the transfer NMOS transistors, thereby being capable of obtaining a SRAM cell having higher soft error resistance.

In this structure, back gate voltage is sometimes applied to the transfer NMOS transistors. This makes the threshold value high to thereby reduce the driving ability of the transfer NMOS transistors. However, this structure can be applied considering a balance between the soft error resistance and an operation speed required for the semiconductor memory device to be obtained.

Embodiment 4

Figure 7:
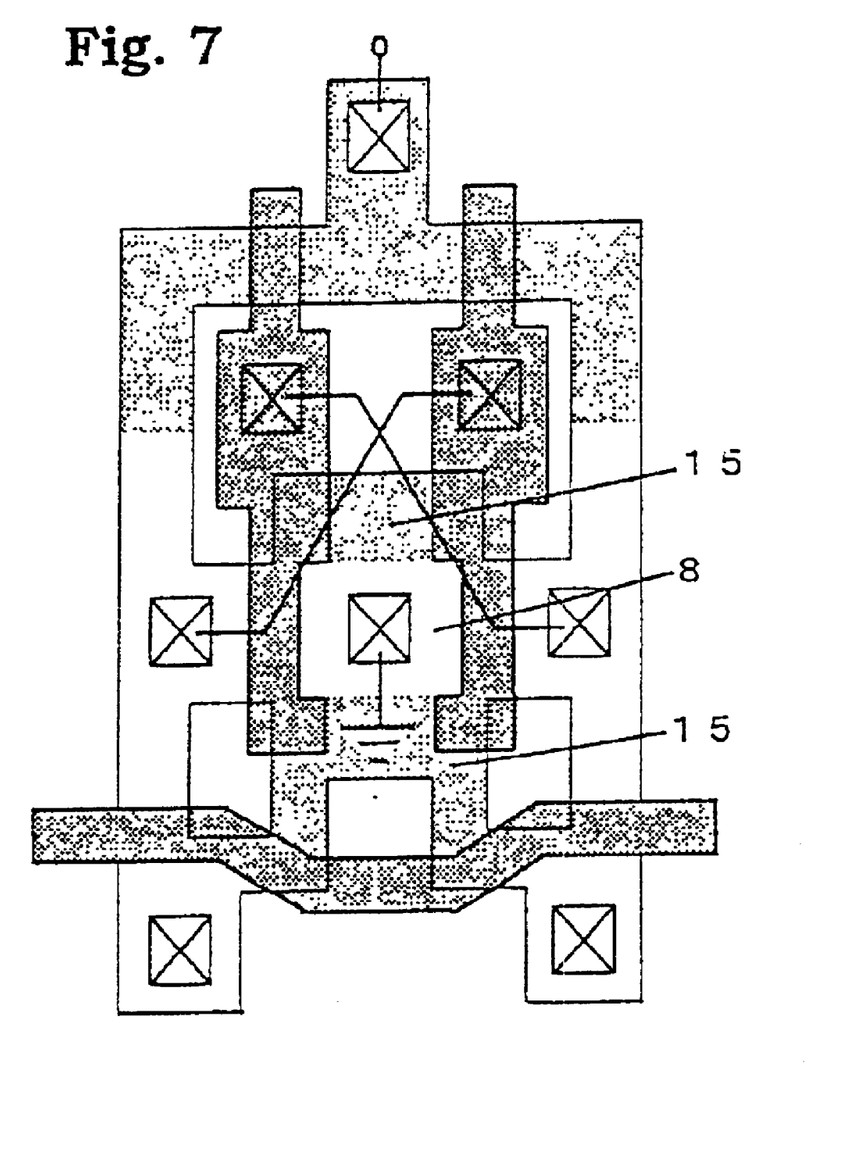
FIG. 7 is a schematic plan view showing an essential section of still another embodiment of a semiconductor memory device according to the present invention.

The CMOS/SRAM cell in this embodiment applies both features of the embodiments 2 and 3 as shown in FIG. 7.

This structure enjoys advantages of both embodiments, thereby being capable of obtaining a SRAM cell having extremely high soft error resistance.

According to the present invention, the formation of the drawing diffusion layer in contact with the source/drain region enables to effectively draw out and eliminate the holes/electrons generated due to the soft error and accumulated in the channel region. Moreover, the drawing diffusion layer is not required to be formed in the special region, but can be arranged in the region used conventionally for the device isolating region. Consequently, a highly reliable semiconductor device can be obtained without increasing the cell area.

The drawing diffusion layer can be formed by utilizing the ion-implantation process among the conventional manufacturing processes, whereby a highly reliable device can simply and assuredly be manufactured without adding another manufacturing process. This enables to realize the reduction in manufacturing cost.

What is claimed is:

1. A semiconductor device comprising:

an SOI substrate having a surface semiconductor layer, a gate electrode formed on the surface semiconductor layer via a gate insulating film, first conductive type source/drain regions formed in the surface semiconductor layer on both sides of the gate electrode, a second conductive type drawing diffusion layer formed in the surface semiconductor layer and contacting at least one of the first conductive type source/drain regions, a silicide layer which is formed on the surface semiconductor layer to partially or entirely overlie both said at least one of source/drain regions and the drawing diffusion layer which are immediately adjacent one another and of different conductivity types, wherein the suicide layer is grounded so as to provide means for causing holes/electrons generated due to soft error and/or alpha-ray(s) to be drawn out of a second conductivity type channel region via the drawing diffusion layer and the silicide layer, wherein the channel and drawing diffusion layer are of the same conductivity type, and the drawing diffusion layer is located between the channel and the at least one source/drain region so that the drawing diffusion layer is immediately adjacent the channel.

2. A semiconductor device claimed in claim 1, wherein said silicide layer comprises $TiSi_2$, $CoSi_2$, $WSi_2$, $PtSi$, $MoSi_2$, $Pd_2Si$ or $TaSi_2$.

3. A semiconductor device claimed in claim 1, wherein the second conductive type drawing diffusion layer is a p-type impurity diffusion layer.

4. A semiconductor device claimed in claim 1, which forms a CMOS with a semiconductor device having a gate electrode formed on the surface semiconductor layer via a gate insulating film and second conductive type source/drain regions formed on the surface semiconductor layers.

5. A semiconductor device comprising:

an SOI substrate having a surface semiconductor layer, a gate electrode formed on the surface semiconductor layer via a gate insulating film, first conductive type source/drain regions formed in the surface semiconductor layer on both sides of the gate electrode, a second conductive type drawing diffusion layer formed in the surface semiconductor layer and contacted with at least one of the first conductive type source/drain regions, and a first conductivity type impurity diffusion layer which is formed in the surface semiconductor layer and adjacent to the drawing diffusion layer, the first conductive type impurity diffusion layer being grounded.

6. A semiconductor device claimed in claim 5, wherein the first conductive type impurity diffusion layer is formed as a source/drain region of another semiconductor device.

7. A semiconductor device claimed in claim 5, wherein a plurality of the first conductive type impurity diffusion layers are radially formed with the second conductive type drawing diffusion layer as a center so as to be adjacent to the second conductive type drawing diffusion layer.

8. A semiconductor device comprising:

an SOI substrate comprising a surface semiconductor layer, a gate electrode supported by at least the surface semiconductor layer with a gate insulating film at least partially therebetween, first conductivity type source/drain regions formed in the surface semiconductor layer on opposite sides of the gate electrode, a second conductivity type drawing diffusion layer formed in the surface semiconductor layer and in contact with at least one of the first conductivity type source/drain regions, and a first conductivity type impurity diffusion layer formed in the surface semiconductor layer adjacent to and contacting the second conductivity type drawing diffusion layer, the first conductivity type impurity diffusion layer at a potential(s) so as to comprise means for drawing out electron holes from the drawing diffusion layer via the first conductivity type impurity diffusion layer.

9. The semiconductor device of claim 8, wherein said potential is ground.

10. A semiconductor device comprising:

an SOI substrate comprising a surface semiconductor layer, a gate electrode formed on the surface semiconductor layer via at least a gate insulating film, first conductive type source/drain regions formed in the surface semiconductor layer on opposite sides of the gate electrode, a second conductive type drawing diffusion layer formed in the surface semiconductor layer and contacting at least one of the first conductive type source/drain regions, a silicide layer formed on the surface semiconductor layer to partially or entirely overlie both said at least one of source/drain regions and the drawing diffusion layer;

a dielectric layer provided over at least part of the silicide layer; and wherein at least one contact hole is defined in said dielectric layer thereby enabling electron holes to be drawn out of a channel region through the drawing diffusion layer and the silicide layer via the contact hole, wherein the channel region and drawing diffusion layer are of the same conductivity type, and the drawing diffusion layer is located between the channel region and the at least one source/drain region so that the drawing diffusion layer is immediately adjacent the channel region.

* * * * *